United States Patent [19]

Wozniczka

[11] Patent Number: 4,708,659
[45] Date of Patent: Nov. 24, 1987

[54] PC BOARD CONNECTOR WITH SHORTING BUS BAR

[75] Inventor: George Wozniczka, Chicago, Ill.

[73] Assignee: Zenith Electronics Corporation, Glenview, Ill.

[21] Appl. No.: 900,027

[22] Filed: Aug. 25, 1986

[51] Int. Cl.⁴ .............................................. H01R 9/09
[52] U.S. Cl. ........................................ 439/62; 439/92
[58] Field of Search ............ 339/17 L, 17 LM, 17 M, 339/17 LC, 19, 14 R, 242; 361/407, 412, 413; 439/62, 92

[56] References Cited

U.S. PATENT DOCUMENTS

| | | | |
|---|---|---|---|
| 3,061,761 | 10/1962 | Blain | 361/413 |
| 3,470,421 | 9/1969 | Shore et al. | 339/17 L |
| 4,030,792 | 6/1977 | Fuerst | 339/17 LC |
| 4,487,464 | 12/1984 | Kirschenbaum | 339/19 |

*Primary Examiner*—Neil Abrams

[57] ABSTRACT

An elongated printed circuit (PC) board connector having a plurality of terminal pins aligned in a linear array has attached to its terminal pins an elongated, linear, U-shaped bus bar with a plurality of apertures in its lower edge. A plurality of U-shaped conductors are inserted through respective pairs of edge apertures in the bus bar, with the distal ends of each of the conductors adapted for coupling to a terminal on a PC board upon which the connector is mounted by means of a pair of support columns and nut/bolt combinations. The bus bar, terminal pins and conductor combination is then dip soldered to establish mechanical coupling and electrical connection therebetween. The shorting bus bar electrically couples the conductors to the terminal pins, with each conductor coupled across a plurality of terminal pins which are thus maintained at the same voltage to maintain the bus bar at a constant, uniform voltage over its entire length and to provide this well-defined voltage level to the PC board terminals.

15 Claims, 5 Drawing Figures

U.S. Patent  Nov. 24, 1987  4,708,659
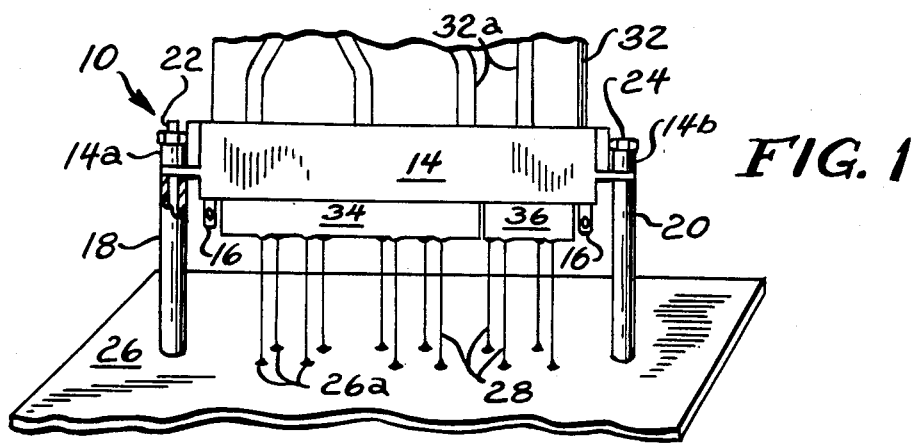
FIG. 1
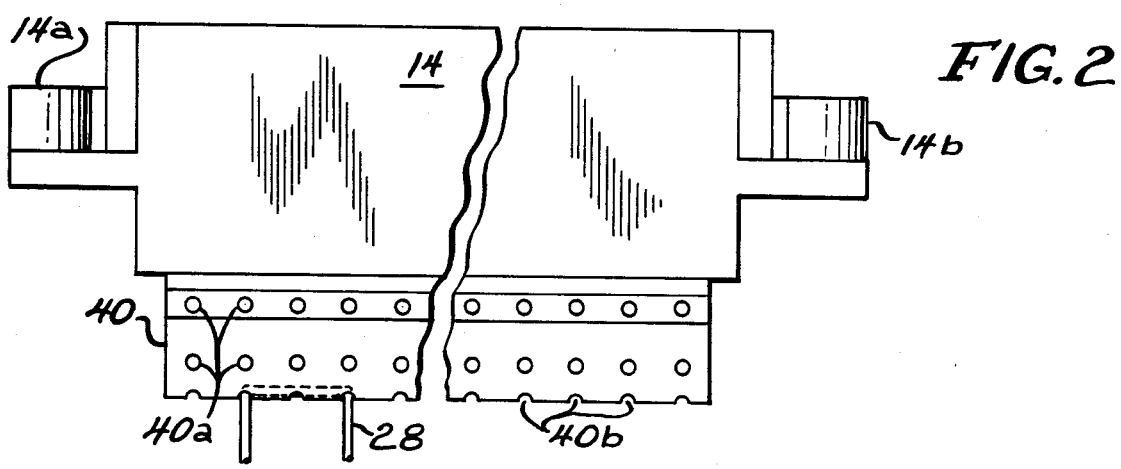
FIG. 2
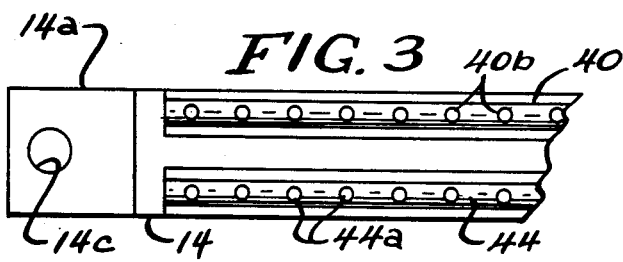
FIG. 3
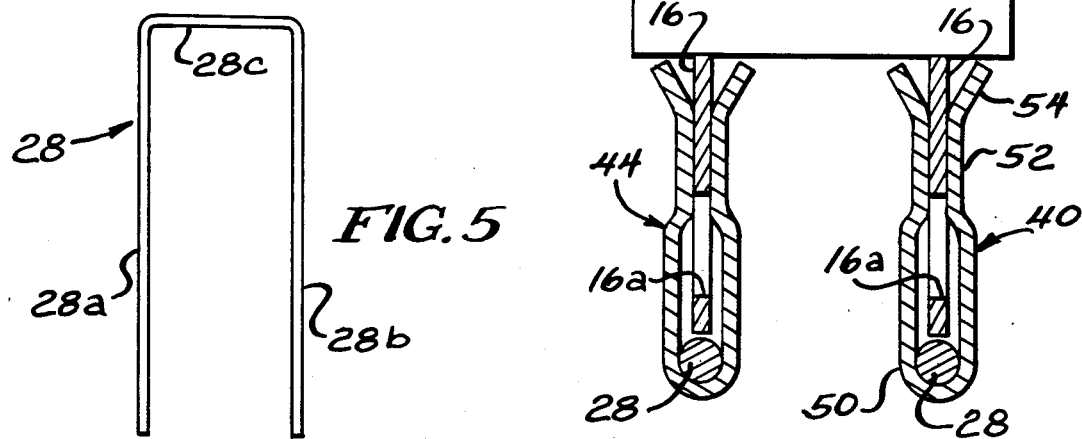
FIG. 4
FIG. 5

PC BOARD CONNECTOR WITH SHORTING BUS BAR

BACKGROUND OF THE INVENTION

This invention relates generally to electrical connectors and is particularly directed to a PC board edge connector arrangement for maintaining a plurality of its connector pins at one or more precisely defined voltage levels.

Elongated, linear connectors are commonly used for electrically connecting a printed circuit (PC) board to another electronic/electrical circuit or component. These PC board edge connectors typically include an elongated plastic housing open along opposing edges thereof, with a plurality of linearly aligned female terminals adapted to engage various conductors on a PC board positioned adjacent one open edge of the connector and a plurality of terminal pins positioned adjacent a second, facing edge of the connector. This connector configuration permits the PC board conductors to be electrically coupled via the edge connector's terminal pins to other circuitry not mounted on the edge-connected PC board. Frequently, the edge connector's terminal pins are electrically coupled to a second PC board.

The prior art discloses various arrangements for coupling the edge connector's terminal pins to a second PC board. For example, each individual connector terminal pin may be hard wired to a respective terminal or conductor on the second PC board. Thus, a 25 pin edge connector would require 25 individual leads in coupling it to a PC board. Since each of these leads must be manually coupled at both ends thereof such as by crimping and/or soldering, this approach is somewhat unreliable in terms of the integrity of the electrical connections and is also labor intensive and thus expensive. Another approach makes use of a comb-like conductor having a plurality of linearly aligned teeth, each of which is coupled to a respective terminal pin of the edge connector by a combination of crimping and soldering. A single wire is then typically soldered to the base of the comb-like conductor and is, in turn, coupled to another circuit. This approach is of limited use where it is desired to provide one or more precisely defined voltage levels at the output of the edge connector since the resistance and thus the voltage across the comb-like conductor depends upon where along its length the conductor or conductors are coupled. In addition, the second soldering process frequently results in disruption of connections made in the preceding soldering step making this approach unreliable.

The present invention overcomes the aforementioned limitations of the prior art by providing a PC board edge connector with a shorting bus bar which provides a well defined voltage, or voltages, across its entire length in an arrangement which is adapted for inexpensive, reliable and rapid fabrication.

OBJECTS OF THE INVENTION

Accordingly, it is an object of the present invention to provide an improved multi-pin electrical connector.

It is another object of the present invention to provide one or more precisely defined voltage levels on the output pins of an electrical connector.

A further object of the present invention is to provide a more reliable and cheaper method for fabricating a multi-pin PC board connector.

A still further object of the present invention is to provide more precise voltage distribution over a multi-pin edge connector.

Yet another object of the present invention is to provide for the manufacture of a multi-pin PC board edge connector using a single soldering step.

Another object of the present invention is to provide a high degree of flexibility in deriving a plurality of precisely defined voltage levels in a multi-pin electrical connector.

It is a further object of the present invention to provide for more secure and reliable electrical connections in a multi-pin edge connector.

It is yet another object of the present invention to provide an improved arrangement for interconnecting pins of an edge connector in a shorted manner to provide common voltage outputs from the connector.

Another object of the present invention is to provide a multi-pin PC board connector capable of compensating for PC board positioning variations while ensuring proper seating of the connector on the PC board.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

FIG. 1 is a perspective view of a PC board edge connector with shorting bus bar in accordance with the present invention electrically coupling first and second PC boards;

FIG. 2 is a lateral view of a partially assembled PC board connector with shorting bus bar of the present invention;

FIG. 3 is a bottom edge-on view of the partially assembled PC board connector with shorting bus bar of FIG. 2;

FIG. 4 is a sectional view of the PC board connector of the present invention having two parallel, spaced arrays of terminal pins extending therefrom; and FIG. 5 illustrates a U-shaped conductor for use in the PC board connector with shorting bus bar of the present invention.

DETAILED DESCRIPTION OF THE PREFERRED EMBODIMENT

Referring to FIG. 1, there is shown a connector with shorting bus bar 10 in accordance with the present invention. The connector 10 includes an elongated, linear housing 14 comprised of an insulating material such as plastic. The housing 14 is open along the upper and lower edge portions thereof and typically includes a plurality of female connecting means (not shown) aligned along the open upper edge thereof and a plurality of corresponding male connecting means such as terminal pins 16 positioned along the length of the open, lower edge portion of the connector. Respective pairs of the female and male connecting means within the housing 14 are electrically coupled together.

The upper edge portion of the housing 14 is adapted to receive the edge of a first PC board 32 having a plurality of conductors 32a on one or both sides thereof. The female coupling means positioned adjacent to and within the upper edge portion of the housing 14 are adapted to engage the PC board conductors 32a and to support and maintain the PC board 32 securely coupled to the connector 10.

Positioned on respective ends of the housing 14 are first and second mounting flanges 14a and 14b. Each of the mounting flanges 14a, 14b includes an aperture 14c, as shown in the bottom edge view of the PC board connector of FIG. 3. Each of the first and second flanges 14a, 14b is further adapted for positioning upon and coupling to first and second flexible sleeves 18, 20, respectively, for mounting the PC board connector 10 on a second PC board 26. A first mounting bolt/nut combination 22 is adapted for insertion in the first sleeve 18 in coupling the first mounting flange 14a of the housing 14 to the second PC board 26. Similarly, a second mounting bolt/nut combination 24 is adapted for insertion in the second mounting sleeve 20 for coupling the second mounting flange 14b of the housing 14 to the second PC board 26. In this manner, the PC board connector 10 of the present invention may be securely coupled to and mounted upon in a spaced manner the second PC board 26, with its lower open edge portion in facing relation with respect to the second PC board.

As described above, a plurality of terminal pins 16 are typically positioned along the length of and within the lower edge portion of the connector housing 14. The two end terminal pins 16 are shown in FIG. 1 for illustrative purposes and would normally be covered by and enclosed within a bus bar and solder as described below. A pair of solder dipped bus bars are shown as elements 34 and 36 in FIG. 1. A plurality of conductors 28 extend downward from the lower edge portion of the PC board connector 10 and are coupled to respective conductors or terminals 26a on the PC board 26. In this manner, the PC board connector 10 of the present invention electrically couples the first PC board 32 to the second PC board 26.

Referring to FIGS. 2, 3 and 4, there are shown various views of portions of the PC board connector of the present invention. The connector includes a first bus bar 40 which is in the form of an elongated, linear structure comprised of a conductive material and which is resilient or somewhat flexible in nature. As shown in FIG. 4, the bus bar 40 has a generally U-shaped cross section and is open at the top along the length thereof and includes a closed, concave lower edge portion 50 and an upper open portion 54 defined by a pair of diverging sections extending the length of the bus bar. Positioned intermediate the lower concave closed portion 50 and the upper diverging open portion 54 of the bus bar 40 is an intermediate engaging portion 52 defined by a pair of spaced, parallel, lateral sections of the bus bar. The spacing between the lateral portions of the bus bar 40 defining its intermediate engaging portion 52 is such that the bus bar may be inserted in a tight fitting manner over a plurality of linearly aligned connector terminal pins 16 along the length of the bus bar. The flexible resilience of the bus bar 40 as well as the aforementioned dimensions of its intermediate engaging portion 52 allow the bus bar to securely engage each of the terminal pins 16 and to remain in position thereon. As shown in FIG. 4, the lower, open edge portion of the connector's housing 14 may be provided with a pair of spaced, parallel arrays of terminal pins 16 arranged along the length of the connector. A second bus bar 44 is shown positioned upon and engaging the left, parallel array of terminal pins 16 in FIG. 4. Each of the terminal pins 16 may be provided with an aperture 16a therein, although the presence of such an aperture in the terminal pins is not essential for the fabrication or proper operation of the present invention.

FIG. 2 is a lateral view of the combination of housing 14 and the first bus bar 40 positioned thereon, while FIG. 3 is a lower edge-on view of the first and second bus bars 40, 44 positioned on the lower, open edge of the housing 14. As shown in FIG. 2, the first bus bar 40, which is identical in configuration and composition to the second bus bar 44 shown in FIG. 4, includes a plurality of lateral apertures 40a on both lateral portions thereof and a plurality of edge apertures 40b. The lateral and edge apertures 40a, 40b are disposed in a spaced, periodic array along the entire length of the bus bar 40.

The PC board connector of the present invention further includes a generally U-shaped conductor 28, illustrated in FIG. 5, comprised of first and second parallel, spaced lower portions 28a, 28b and an upper portion 28c. The upper portion 28c of the conductor 28 couples the first lower portion 28a to the second lower portion 28b at the respective upper ends thereof. The first and second lower portions 28a, 28b of the conductor 28 are adapted for insertion within respective edge apertures 40b of the bus bar 40. With the first and second lower portions 28a, 28b of the conductor 28 inserted through and positioned within a pair of edge apertures 40b of the bus bar 40, the upper portion 28c of the conductor is positioned within and engaged by the lower concave closed portion 50 of the bus bar as shown in FIG. 4. In this manner, one or more U-shaped conductors 28 may be positioned within, extend from, and be supported by the bus bar 40. With the bus bar 40 engaging a linear array of terminal pins 16, one or more of the conductors 28 may be positioned in close proximity to or in contact with one or more terminal pins extending downward from the conductor's housing 14. The length of the upper portion 28c of the conductor 28 may extend from one end of the bus bar 40 to its other end permitting the lower portions 28a, 28b of the conductor to be inserted through the apertures on the respective end portions of the lower edge of the bus bar 40. On the other hand, the length of the upper portion 28c of the conductor 28 may only extend between adjacent edge apertures 40b within the bus bar 40. Therefore, the length of the upper portion 28c of the conductor 28 may be selected in accordance with the spacing of the terminals 26a on the PC board 26 as shown in FIG. 1.

After the conductor 28, or conductors, is inserted in and engaged by the bus bar 40, the connector terminal pins 16 are inserted in the upper diverging open portion 54 of the bus bar. The bus bar 40 is then connected to the PC board connector by means of the terminal pins 16 in its housing 14 with the conductor 28 also coupled to the connector's terminal pins. The bus bar 40 as well as the conductor 28 are comprised of a material having high electrical conductivity.

With one or more conductors 28 positioned within and engaged by the bus bar 40 and coupled to and suspended from the PC board connector 10, the lower edge portion of the PC board connector including the conductors, bus bar and terminal pins is then dipped in solder to provide one or more solder portions 34, 36 extending downward from the connector's housing as shown in FIG. 1. In this manner, one or more conductors 28 may be physically connected and electrically coupled across a plurality of terminal pins 16 positioned within a common solder portion. As shown in FIG. 1, first and second solder portions 34, 36 may be of different lengths so as to include various numbers of terminal pins and may further be coupled to one or more conductors 28. All of the terminal pins within a given solder portion as well as all of the conductors extending therefrom are maintained at the same voltage to ensure that all of the conductors coupled to the second PC board 26 provide the same voltage level to all of its terminals 26a. The first and second parallel rows of terminal pins 16 on the PC board connector may be divided into various solder portions, each of which will provide a single, precisely defined voltage level to the PC board 26 via the conductors coupled thereto. For example, in a typical computer application, the PC board edge connector 10 is coupled to a first power supply PC board 32 for providing three DC voltage levels of 0, +5 and −12 VDC. The various solder sections on the lower edge portion of the PC board connector 10 may be formed and defined by the configuration of the solder container or containers into which the various combinations of conductors 28 and bus bars 40 and 44 are dipped. The lateral apertures 40a as well as the unused edge apertures 40b in the bus bar 40 facilitate the flow of solder into the bus bar and about the terminal pins 16 and conductors 28 positioned therein for improved strength and reliability in the formation of electrical connections.

The manner in which the edge connector 10 is mounted to the PC board 26, i.e., by means of a pair of elongated flexible cylindrical sleeve and bolt/nut combinations, allows for lateral displacement of the connector parallel to the plane of the PC board once mounted thereon. This permits the conductors 28 to be inserted in the PC board's apertures 26a even when the PC board is not precisely positioned relative to the connector 10. The manner in which the connector 10 is mounted upon the PC board 26 thus compensates for variations in the position of the PC board with respect to the connector as the connector is mounted thereon.

There has thus been shown a PC board edge connector with shorting bus bar which is formed in a single soldering process, affords more accurate voltage distribution along the length of the connector, ensures highly reliable electrical connection along the entire length of the connector, and provides a continuum of shorting points along the length of the connector which may be divided into sections along its length to provide various, well defined output voltage levels.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

I claim:

1. A PC board edge connector coupled to a first PC board maintained at a given voltage level, said connector comprising:

an elongated housing open along first and second facing edges thereof and adapted for coupling to the first PC board along the first edge thereof and including a plurality of spaced, linearly aligned terminal pins along the second edge thereof;

conductive mounting means for engaging a plurality of said terminal pins of said housing, said conductive mounting means including an elongated, linear bus bar comprised of a resilient material and having an upper, open edge adapted to receive said terminal pins in tight-fitting engagement and a lower, closed edge;

conducting means including a plurality of leads extending therefrom engaged by the lower, closed edge of said mounting means and maintained in electrical connection with and across a plurality of said terminal pins by said mounting means; and conductive coupling means for electrically coupling said terminal pins, said mounting means and said conducting means, wherein the leads of said conducting means are maintained at the voltage level of the first PC board.

2. The PC board edge connector of claim 1 further comprising mounting means for securely positioning the edge connector on a second PC board.

3. The PC board edge connector of claim 2 wherein said mounting means includes spacer means for mounting said connector to said second PC board in a spaced manner.

4. The PC board edge connector of claim 3 wherein said spacer means includes a plurality of elongated, linear sleeves for engaging and supporting respective end portions of said housing.

5. The PC board edge connector of claim 4 wherein said mounting means further includes a plurality of nut and bolt combinations adapted for insertion within a respective one of said sleeves and coupling to said second PC board as well as to respective ends of said housing.

6. The PC board edge connector of claim 5 wherein the PC board includes a plurality of apertures each adapted to receive a respective connector lead and wherein said sleeves are flexible to allow for limited displacement of the connector in a plane parallel to the plane of the PC board to facilitate alignment of said leads with said PC board apertures.

7. The PC board edge connector of claim 1 wherein the lower edge of said bus bar includes a plurality of apertures along the length thereof through which the leads of said conducting means extend.

8. The PC board edge connector of claim 7 wherein said conducting means is a generally U-shaped conductor having an intermediate portion coupling respective ends of the leads thereof.

9. The PC board edge connector of claim 8 wherein the leads of the U-shaped conductor extend through edge apertures of the bus bar and the intermediate portion of the conductor is positioned within the bus bar.

10. The PC board edge connector of claim 9 wherein said conductive coupling means is solder.

11. The PC board edge connector of claim 10 wherein said bus bar includes a plurality of lateral apertures along the length thereof to facilitate the flow of said solder into said bus bar and onto said terminal pins and conductive means.

12. The PC board edge connector of claim 11 wherein said bus bar has an open upper diverging portion to facilitate its positioning on and engagement with the terminal pins.

13. The PC board edge connector of claim 12 wherein said bus bar further includes an intermediate portion positioned between the upper and lower portions thereof and having a pair of spaced members for securely engaging the terminal pins therebetween along the length of said bus bar.

14. The PC board edge connector of claim 1 wherein said connector is coupled to a second PC board having a plurality of terminals to each of which is coupled a respective one of said leads of said conducting means.

15. The PC board edge connector of claim 1 further including a plurality of combinations of mounting means, conducting means and coupling means coupled to and engaging respective pluralities of connector terminal pins.

* * * * *